United States Patent
Okada et al.

(10) Patent No.: US 7,208,418 B1
(45) Date of Patent: Apr. 24, 2007

(54) SEALING SIDEWALL PORES IN LOW-K DIELECTRICS

(75) Inventors: Lynne A. Okada, Sunnyvale, CA (US); Minh Quoc Tran, Milpitas, CA (US); Fei Wang, San Jose, CA (US); Lu You, San Jose, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 137 days.

(21) Appl. No.: 10/728,774

(22) Filed: Dec. 8, 2003

(51) Int. Cl.
*H01L 21/311* (2006.01)

(52) U.S. Cl. .................. 438/696; 438/627; 438/628; 438/637; 438/643; 438/644; 257/E23.116; 257/E21.579

(58) Field of Classification Search .......... 438/627, 438/628, 637, 643, 644, 696; 257/E23.116, 257/E21.579
See application file for complete search history.

(56) References Cited

U.S. PATENT DOCUMENTS

| | | | |
|---|---|---|---|
| 5,534,356 A * | 7/1996 | Mahulikar et al. | 428/615 |
| 5,916,823 A | 6/1999 | Lou et al. | |
| 6,180,518 B1 * | 1/2001 | Layadi et al. | 438/639 |
| 6,514,881 B1 * | 2/2003 | Coffman | 438/780 |
| 6,528,409 B1 * | 3/2003 | Lopatin et al. | 438/618 |
| 6,537,896 B1 * | 3/2003 | Catabay et al. | 438/474 |
| 6,734,090 B2 * | 5/2004 | Agarwala et al. | 438/598 |
| 6,756,672 B1 * | 6/2004 | You et al. | 257/751 |
| 7,052,990 B2 * | 5/2006 | Kim | 438/637 |
| 2001/0051420 A1 * | 12/2001 | Besser et al. | 438/597 |
| 2003/0207559 A1 * | 11/2003 | Restaino et al. | 438/623 |
| 2005/0082676 A1 * | 4/2005 | Andry et al. | 257/763 |

* cited by examiner

Primary Examiner—Michelle Estrada

(57) ABSTRACT

Barrier metal layer discontinuities or gaps due to low-k dielectric porosity is reduced by sealing sidewall porosity before barrier metal layer deposition. Embodiments include sealing sidewall porosity by depositing a swelling agent, adhesion promoter or an additional layer of low-k material.

9 Claims, 6 Drawing Sheets

SEALING SIDEWALL PORES IN LOW-K DIELECTRICS

FIELD OF THE INVENTION

The present invention relates to a method of manufacturing a semiconductor device exhibiting increased operating speed and improved reliability. The present invention has particular applicability in manufacturing high density, multi-level semiconductor devices comprising sub-micron dimensioned interconnects formed with high precision and improved reliability.

BACKGROUND ART

Interconnection technology is constantly challenged to satisfy the ever increasing requirements for high density and performance associated with ultra large scale integration semiconductor devices. The speed of semiconductor circuitry varies inversely with the resistance (R) and capacitance (C) of the interconnection system. The higher the value of the R×C product, the more limiting the circuit speed. As integrated circuits become complex and feature sizes and spacings become smaller, the integrated circuit speed becomes less dependent upon the transistor itself and more dependent upon the interconnection pattern. Thus, the performance of multi-level interconnects is dominated by interconnect capacitance at deep sub-micron regimes, e.g., less than about 0.12 micron. The rejection rate due to integrated circuits speed delays in sub-micron regimes has become a limiting factor in fabrication.

The dielectric constant (k) of materials currently employed in the manufacture of semiconductor devices for an interlayer dielectric (ILD) ranges from about 3.9 for dense silicon dioxide to over 8 for deposited silicon nitride. The value of the dielectric constant (k) expressed herein is based upon a value of one (1) for a vacuum. In an effort to reduce interconnect capacitance, dielectric materials with lower values of permitivity have been employed. The expression "low-k" material has evolved to characterize materials with a dielectric constant less than about 3.9, e.g., less than 3.5. Porous low-k dielectric materials, e.g., dielectric materials having a porosity of 1% to 70%, offer promise, such as porous SiLK™ available from Dow Chemical, located in Midland, Mich., and JSR5108 or JSR5109 available from JSR, located in Japan. In attempting to employ such porous low-k dielectric materials in interconnect technology, as for a dielectric layer in damascene techniques, various issues arise. For example, upon forming an opening in such a porous dielectric material, the sidewalls defining the opening have exposed pores. As a result, it is extremely difficult to deposit a continuous barrier metal layer lining the sidewalls without discontinuities stemming from the presence of such exposed pores.

Adverting to FIGS. 1A–1C, reference character 10 generally denotes a substrate which may include various devices formed in a semiconductor substrate as well as overlying layers. Reference character 12 denotes a porous dielectric layer, such as porous SiLK™, formed on an etch-stop layer 11, such as silicon nitride. A capping layer 13, such as silicon nitride, is formed over porous dielectric layer 12, and a photoresist mask 14 is formed thereon. An opening 100 is etched, using the photoresist mask 14, which opening 100 is defined by sidewalls in porous dielectric layer 12 and sidewalls in capping layer 13 and etch-stop layer 11, as shown in FIG. 1B. Since dielectric layer 12 is a porous dielectric material, various pores 15 are exposed on the sidewalls upon forming opening 100.

As microminiaturization proceeds apace, it is extremely difficult to deposit a continuous barrier metal layer, such as tantalum or tantalum nitride, lining an opening. This problem is exacerbated when the sidewalls of the opening contain exposed pores 15. Upon depositing barrier metal layer 16, various discontinuities occur, particularly in regions having exposed pores 15, as schematically illustrated in FIG. 1C.

Accordingly, a need exists for methodology enabling the fabrication of semiconductor devices having reliable interconnects with uniformly deposited barrier metal layers without discontinuities. A particular need exists for methodology enabling the fabrication of such semiconductor devices having copper (Cu) or Cu alloy interconnects using low-k porous dielectric materials.

DISCLOSURE OF THE INVENTION

An advantage of the present invention is a method of manufacturing a semiconductor device exhibiting reduced parasitic R×C time delays employing porous low-k dielectric materials.

Another advantage of the present invention is a semiconductor device having interconnection patterns exhibiting reduced parasitic R×C time delays employing porous low-k dielectric materials.

Additional advantages and other features of the present invention will be set forth in the description which follows and in part will be apparent to those having ordinary skill in the art upon examination of the following or may be learned from the practice of the present invention. The advantages of the present invention may be realized and obtained as particularly pointed out in the appended claims.

According to the present invention, the foregoing and other advantages are achieved in part by a method of manufacturing a semiconductor device, the method comprising: forming an opening in a porous dielectric layer comprising a first low-k material overlying a substrate, the opening defined by sidewalls of the porous dielectric layer having exposed pores; sealing exposed pores in the sidewalls by depositing: a swelling agent lining the sidewalls and heating to swell the porous dielectric layer; an adhesion promoter lining the sidewalls; or a layer of dielectric material on the sidewalls; and depositing a barrier metal layer lining the opening.

Embodiments of the present invention comprise forming a dual damascene opening in a porous dielectric layer, sealing exposed pores, depositing a continuous barrier metal layer lining the opening and filling the opening with Cu or Cu alloy. Embodiments of the present invention further comprise depositing the swelling agent, adhesion promoter or layer of dielectric material on the sidewalls of the opening at a thickness of 10 Å to less than 300 Å, e.g., 10 Å to 250 Å. The layer of dielectric material deposited on the sidewalls may comprise the same dielectric material as or a dielectric material different from the porous low-k dielectric material in which the opening is formed. The layer of dielectric material deposited on the sidewalls may exhibit a porosity substantially the same as that of the porous low-k material in which the opening is formed, or it may be substantially non-porous, e.g., having a porosity no greater than 1%.

Another aspect of the present invention is a semiconductor device comprising: a porous dielectric layer comprising a first low-k dielectric material overlying a substrate; inlaid metal filling an opening in the porous dielectric layer, the opening defined by sidewalls of the porous dielectric layer with exposed pores, and a layer of low-k dielectric material on the sidewalls with an interface therebetween, wherein the metal filling the opening comprises a barrier metal layer lining the opening and a metal on the barrier metal layer filling the opening.

Additional advantages of the present invention will become readily apparent to those skilled in this art from the following detailed description, wherein embodiments of the present invention are described, simply by way of illustration of the best mode contemplated for carrying out the present invention. As will be realized, the present invention is capable of other and different embodiments, and its several details are capable of modifications in various obvious respects, all without departing from the present invention. Accordingly, the drawings and description are to be regarded and illustrative in nature, and not as restrictive.

BRIEF DESCRIPTION OF THE DRAWINGS

In FIGS. 1A–4B, similar features are denoted by similar reference characters.

DESCRIPTION OF THE INVENTION

The present invention addresses and solves problems attendant upon conventional multi-layer interconnect devices, particularly discontinuities in a barrier metal layer deposited on sidewalls of an opening formed in a porous low-k dielectric layer, wherein the sidewalls have exposed pores. The present invention addresses and solves such problems by sealing exposed sidewall pores prior to depositing the barrier metal layer, as by smoothing out the exposed sidewall pores, thereby improving barrier metal layer coverage.

In accordance with the present invention, various embodiments may be implemented to seal exposed sidewall pores, or smooth out the exposed pores in the sidewalls defining an opening formed in a porous interlayer dielectric. In accordance with an embodiment of the present invention, a swelling agent is deposited to line the sidewalls of the opening followed by heating, as at a temperature of about 25° C. to 200° C., thereby swelling the porous dielectric material such that the exposed sidewall porosity is reduced by virtue of the pores shrinking or collapsing. Various swelling agents for low-k dielectric materials are known; one such material is used in the RELACS™ process and available from Clariant located in Japan.

In accordance with another embodiment of the present invention, an adhesion promoter is deposited to seal the exposed sidewall pores and, hence, improve barrier metal layer coverage. For example, an opening may be formed in a porous low-k dielectric layer comprising a material such as SiLK™, available from Dow Chemical Co., Midland, Mich. An adhesion promoter, such as AP6000™ or AP™, also available from Dow Chemical, may be employed to seal exposed sidewall pores.

In accordance with another embodiment of the present invention, an additional thin layer of dielectric material is deposited on the sidewalls of the opening covering exposed pores. Embodiments included depositing a layer of low-k dielectric material which is the same as or different from the low-k dielectric material in which the opening is formed. Embodiments also include depositing a layer of porous or substantially non-porous material on the sidewalls of the opening. For example, an opening may be formed in an interlayer dielectric comprising a porous low-k material, such as JSR5109™, available from JSR located in Japan. A layer of Black Diamond™ available from Applied Materials, Santa Clara, Calif., or a layer of SiLK™ or a layer of Coral™, available from Novellus Systems, San Jose, Calif., may be deposited on the sidewalls of the opening, as at a thickness of 10 Å to less than 300 Å, such as 10 Å to 250 Å.

Figure 1A:
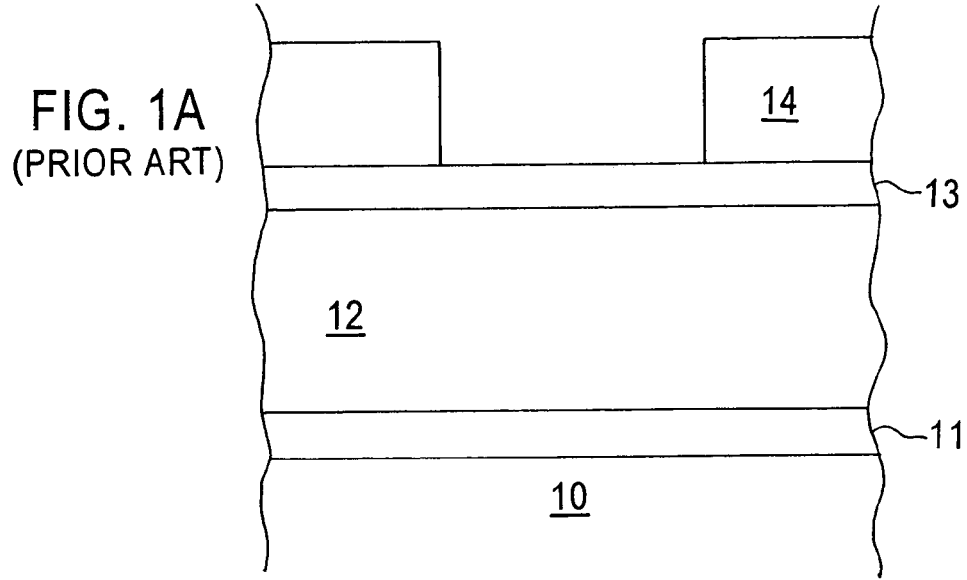
FIGS. 1A–1C illustrate sequential phases of a conventional method.
Figure 1B:
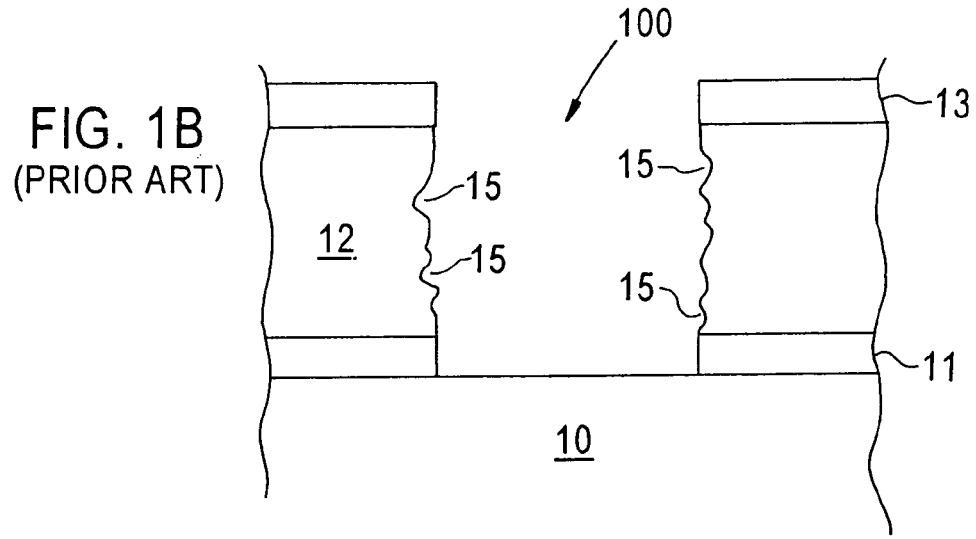
Figure 1C:
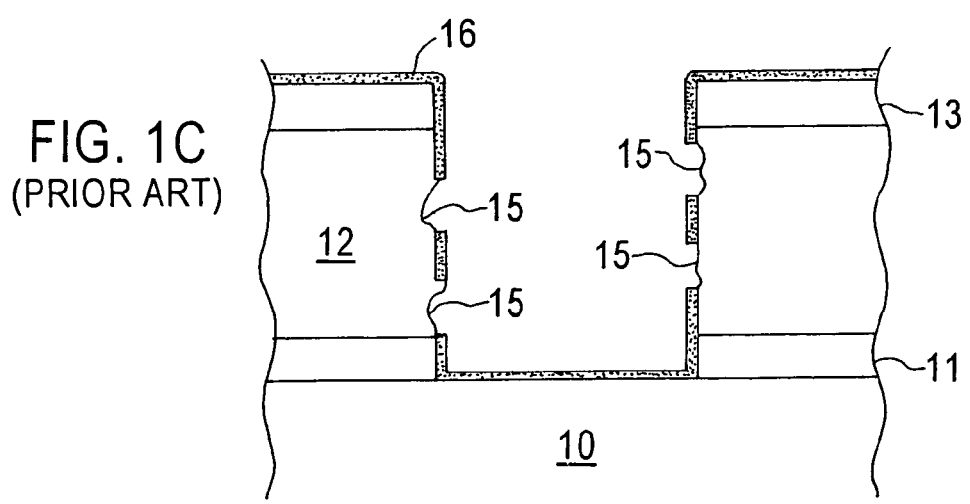
Figure 2A:
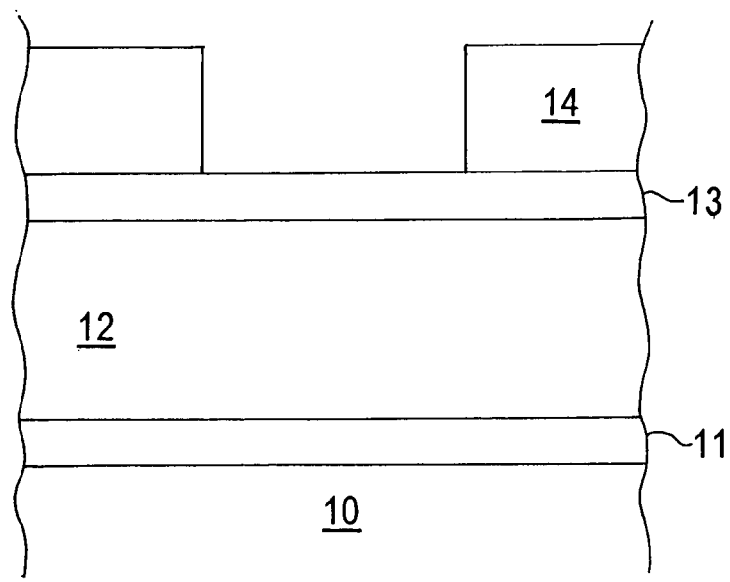
FIGS. 2A–2F schematically illustrate sequential phases of a method in accordance with an embodiment of the present invention.
Figure 2B:
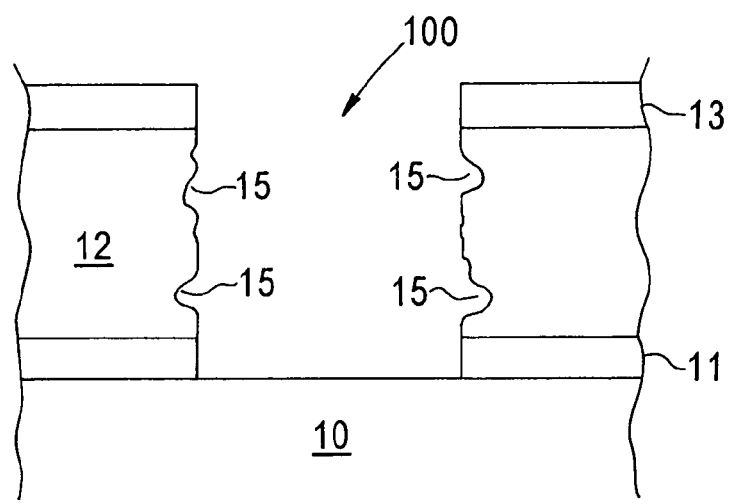
Figure 2C:
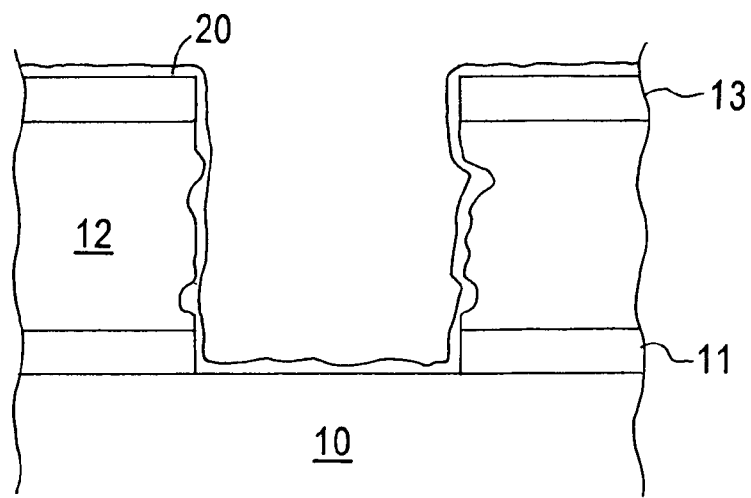
Figure 2D:
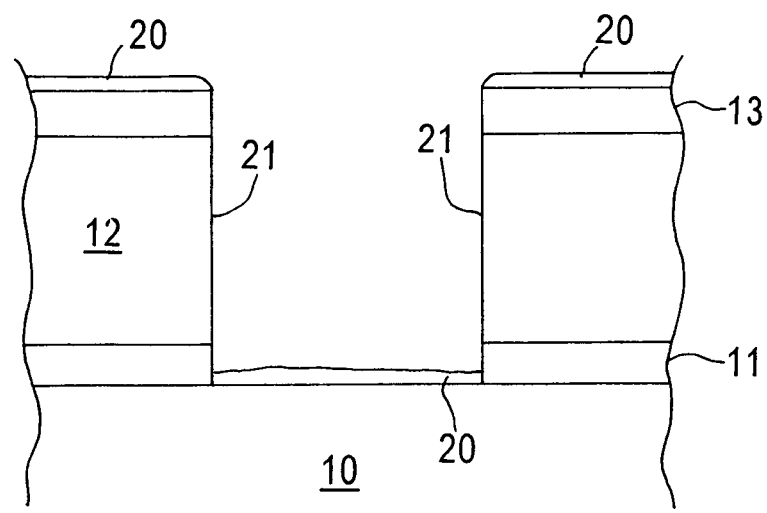
Figure 2E:
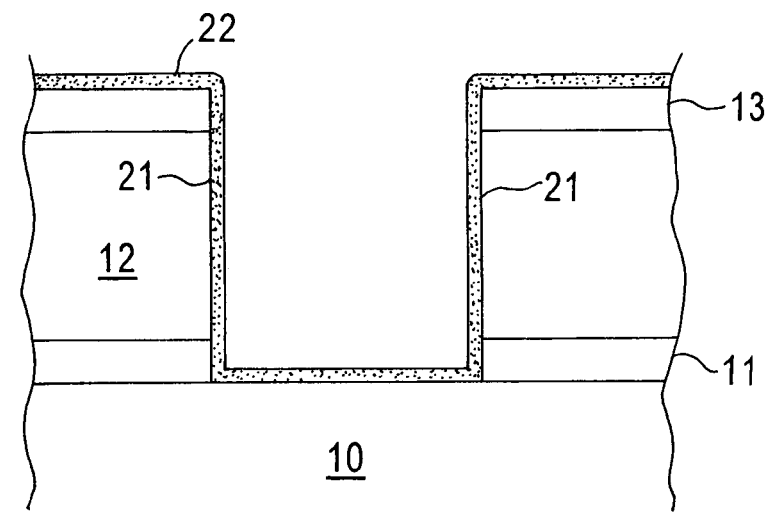
Figure 2F:
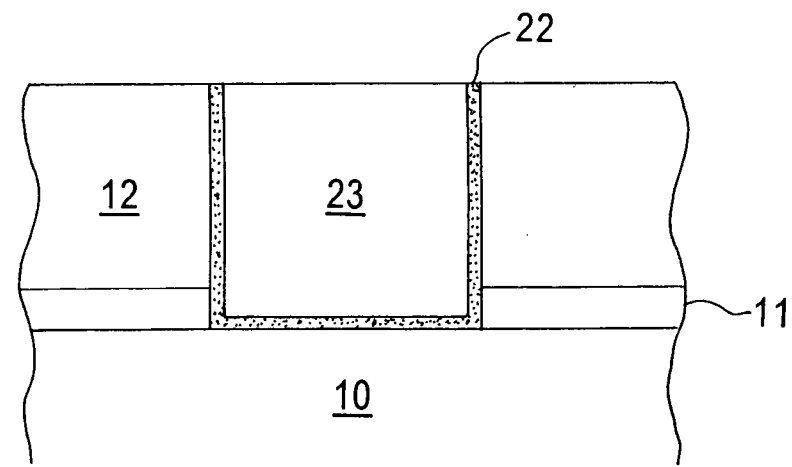

An embodiment of the present invention is schematically illustrated in FIGS. 2A–2F. Adverting to FIG. 2A, an interlayer dielectric 12 comprising a porous low-k material, such as JSR5109™, is deposited over an etch-stop layer 11 formed over substrate 10. A capping layer 13 is formed over porous interlayer dielectric 12. Layers 11 and 13 may comprise silicon nitride or silicon carbide. A photoresist mask 14 is formed over capping layer 13. Subsequently, anisotropic etching is conducted to form opening 100, as illustrated in FIG. 2B. Because dielectric layer 12 comprises a porous material, upon etching opening 100, the sidewalls defining opening 100 comprise exposed porous 15. If the barrier metal layer is deposited at this point, discontinuities would occur as shown in FIG. 1C, thereby adversely impacting device integrity. In accordance with an embodiment of the present invention, a swelling agent 20 is deposited lining the sidewalls. Swelling agent 20 may be RELACS™. Heating is then conducted, as at a temperature of 25° C. to 200° C., to swell porous interlayer dielectric 12, thereby smoothing the sidewalls 21 as shown in FIG. 2D. A barrier metal layer 22, such as tantalum or tantalum nitride, is then deposited on the smooth sidewalls 21, as shown in FIG. 2E. Subsequent processing may be conducted in accordance with conventional practices, as by depositing a metal on barrier metal layer 22 filling the opening and forming an overburden and then conducting chemical mechanical polishing (CMP) resulting in the structure illustrated in FIG. 2F comprising inlaid metal 23, such as Cu or a Cu alloy.

Figure 3A:
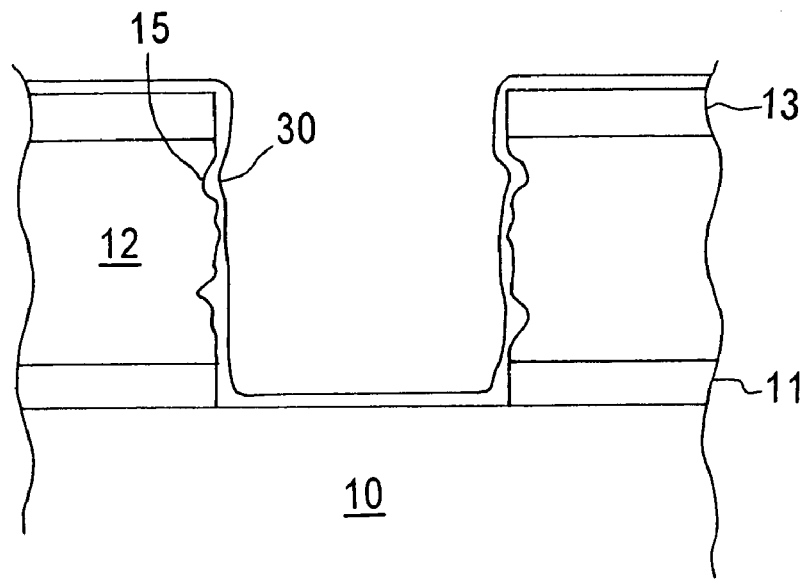
FIGS. 3A–3B represent sequential phases of a method in accordance with another embodiment of the present invention.

In accordance with another embodiment of the present invention, an adhesion promoter 30 is deposited on the intermediate structure illustrated in FIG. 2B resulting in the structure illustrated in FIG. 3A. The adhesion promoter 30, such as AP6000™ or AP™ available from Dow Chemical, seals pores 15 thereby presenting a smooth surface for barrier metal layer deposition. It should be understood that interlayer dielectric 12 may comprise any of various porous dielectric materials such as SiLK™ or JSR™.

Figure 3B:
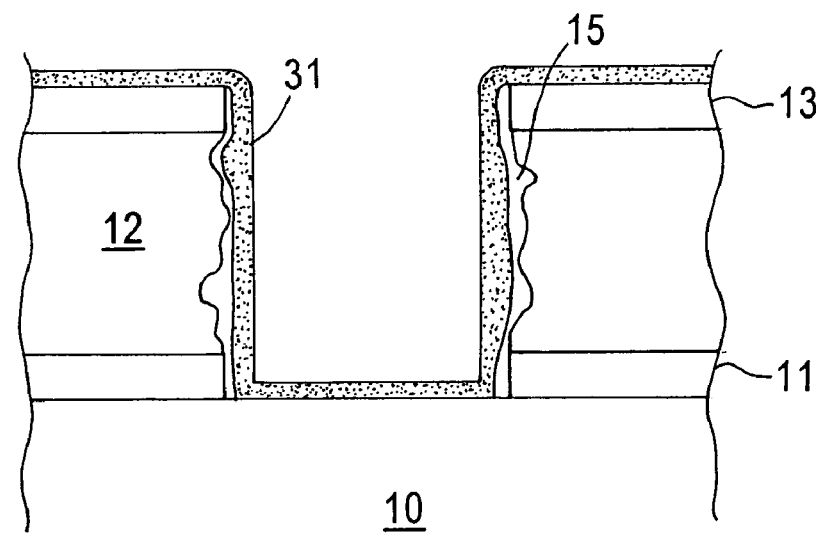

Subsequently, as illustrated in FIG. 3B, a barrier metal layer 31 is deposited without forming discontinuities by virtue of the sidewall smoothing effect of adhesion promoter 30. Subsequent processing may be conducted in a conventional manner, similar to that illustrated in FIG. 2F.

Figure 4A:
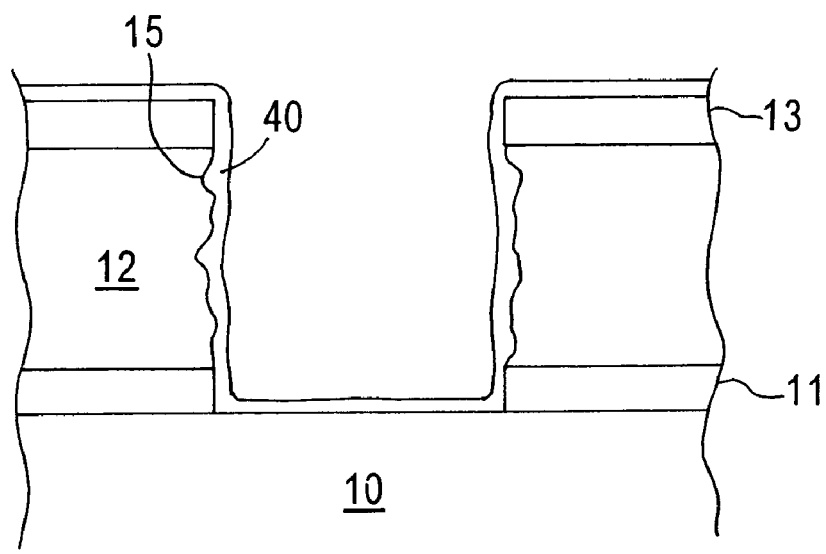
FIGS. 4A and 4B represent sequential phases of a method in accordance with a further embodiment of the present invention.
Figure 4B:
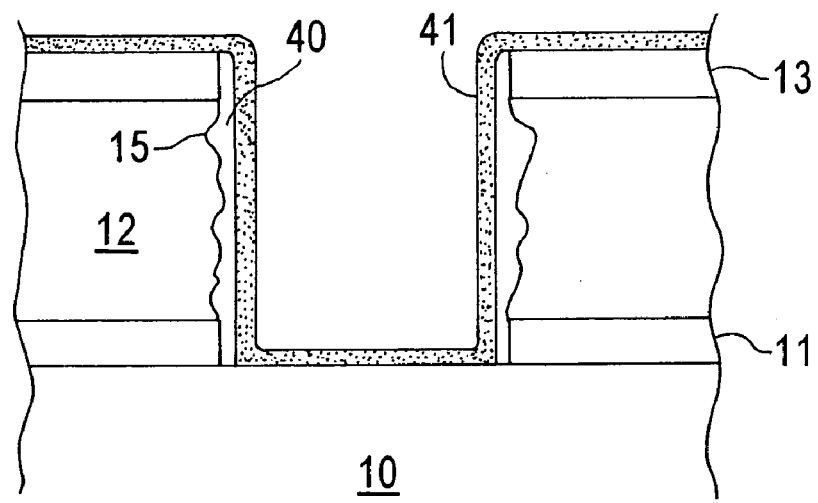

In accordance with another embodiment of the present invention, a dielectric layer 40 is deposited lining the sidewalls in the intermediate structure illustrated in FIG. 2B, resulting in the structure illustrated in FIG. 4A. Dielectric layer 12 may comprise a porous dielectric material such as JSR™ or SiLK™. Dielectric layer 40 may be deposited at a thickness of 10 Å to less than 300 Å, e.g., 10 Å to 250 Å, depending upon the largest dimension of pores 15. Dielectric layer 40 may comprise the same dielectric material as the material comprising porous interlayer dielectric 12, or a different dielectric material. In addition, dielectric layer 40 may comprise a dielectric material having a porosity substantially the same as the porosity of porous interlayer dielectric 12 or a material which is substantially non-porous. By forming a thin layer of dielectric material, e.g., a low-k material, whether porous material or substantially non-porous, on the exposed side surfaces with open porous, the porous sidewalls are smoothed, thereby enabling deposition of a continuous barrier metal layer 41, as shown in FIG. 4B. Subsequent processing may be implemented in a conventional manner, as discussed with respect to FIG. 2F.

Figure 5:
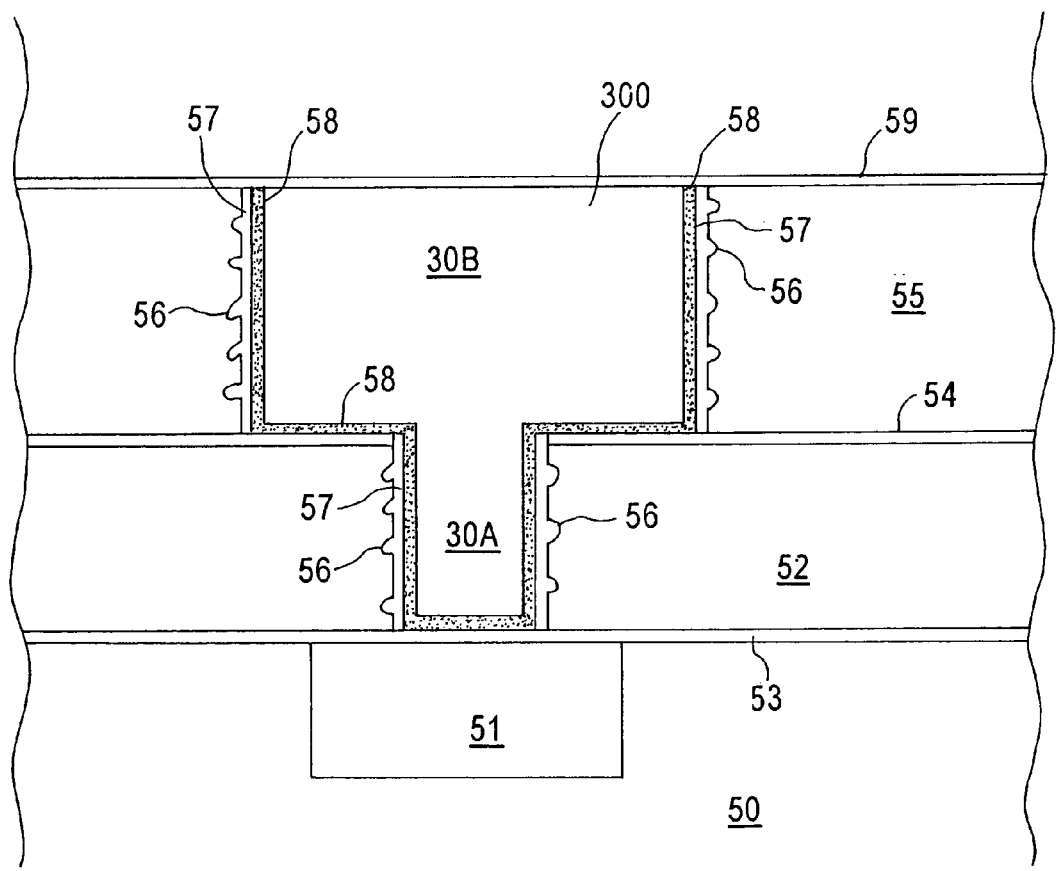
FIG. 5 schematically illustrates a dual damascene embodiment of the present invention.

It should be understood that the openings formed in the dielectric layer, in accordance with embodiments of the present invention, may be dual damascene openings. Adverting to FIG. 5, an underlying conductive feature 51 is formed in substrate 50 with a capping layer 53 thereon. Porous low-k dielectric layers 52 and 55 are sequentially deposited with an intermediate etch-stop layer 54, such as silicon nitride. A dual damascene opening is then formed comprising a lower via section and an upper trench. The sidewalls of the opening contain exposed pores 56. In the embodiment illustrated in FIG. 5, a layer of low-k dielectric material 57, which may comprise a material the same as or different from that employed in layers 52 and 55, is deposited to line the dual damascene opening. Dielectric layer 57 may be porous or substantially non-porous. A barrier metal layer 58, such as tantalum or tantalum nitride, is then deposited. A metal, such as Cu or Cu alloy, is then deposited forming an overburden followed by CMP. The illustrated dual damascene structure comprises inlaid Cu or a Cu alloy 300 comprising an upper line 30B in communication with an underlying via 30A. The present invention includes the use of various metals for the interconnection system, particularly Cu and Cu alloys. A capping layer 59, such as silicon nitride, is formed thereon to determine the bottom etch-stop layer of the next via and metal layers.

A wide variety of low-k materials can be employed in accordance with embodiments of the present invention for an interlayer dielectric and/or the layer deposited on the sidewalls defining an opening. Suitable organic materials include various polyimides and BCB. Other suitable low-k dielectrics include poly(arylene)ethers, poly(arylene)ether azoles, parylene-N, polyimides, polynapthalene-N, polyphenylquinoxalines (PPQ), polyphenyleneoxide, polyethylene and polypropylene. Other low-k materials suitable for use in embodiments of the present invention include XLK™ (HSQ-based), and porous SILK™, an aromatic hydrocarbon polymer (each available from Dow Chemical Co., Midland, Mich.); Coral™, a carbon-doped silicon oxide (available from Novellus Systems, San Jose, Calif.), silicon-carbon-oxygen-hydrogen (SiCOH) organic dielectrics, Black-Diamond™ dielectrics, Flare™, an organic polymer, HOSP™, a hybrid siloxane-organic polymer, and Nanoglass™, and nanoporous silica (each available from Honeywell Electronic Materials) and halogen-doped (e.g., fluorine-doped) silicon dioxide derived from tetraethyl orthosilicate (TEOS) and fluorine-doped silicate glass (FSG).

The present invention provides methodology enabling the fabrication of semiconductor devices having highly reliable interconnects. The present invention is particularly applicable in forming microminiaturized interconnects based on damascene technology comprising uniformly deposited barrier metal layers without discontinuities, thereby improving overall density, increasing operating speed, improving accuracy and precision, and improving device reliability.

The present invention enjoys industrial applicability in manufacturing highly integrated semiconductor devices exhibiting increased circuit speed and sub-micron dimensions, e.g., with a design rule of about 0.12 micron and under.

In the preceding detailed description, the present invention is described with reference to specifically exemplary embodiments thereof. It will, however, be evident that various modifications and changes may be made thereto without departing from the broader spirit and scope of the present invention, as set forth in the claims. The specification and drawings are, accordingly, to be regarded as illustrative and not restrictive. It is understood that the present invention is capable of using various other combinations and environments and is capable of changes or modifications within the scope of the inventive concept as expressed herein.

What is claimed is:

1. A method of manufacturing a semiconductor device, the method comprising:
    forming an opening in a porous dielectric layer comprising a first low-k material overlying a substrate, the opening defined by sidewalls of the porous dielectric layer having exposed pores;
    sealing exposed pores in the sidewalls by depositing:
    a swelling agent lining the sidewalls and heating to swell the porous dielectric layer; and
    depositing a barrier metal layer lining the opening.

2. The method according to claim 1, further comprising:
    filling the opening with metal; and
    conducting chemical mechanical polishing (CMP) such that an upper surface of the metal filling the opening is substantially coplanar with an upper surface of the porous dielectric layer.

3. The method according to claim 2, comprising:
    forming the opening as a dual damascene opening;
    filling the opening with copper (Cu) or a Cu alloy as the metal, wherein the porous dielectric layer has a dielectric constant (k) less than 3.5.

4. A method of manufacturing a semiconductor device, the method comprising:
    forming an opening in a porous dielectric layer comprising a first low-k material overlying a substrate, the opening defined by sidewalls of the porous dielectric layer having exposed pores; sealing exposed pores in the sidewalls by depositing:
    a swelling agent lining the sidewalls and heating to swell the porous dielectric layer;
    an adhesion promoter lining the sidewalls; or
    a layer of dielectric material on the sidewalls; and
    depositing a barrier metal layer lining the opening, the method, comprising depositing the swelling agent, adhesion promoter or layer of dielectric material at a thickness substantially equal to a largest dimension of the exposed pores.

5. The method according to claim 4, comprising depositing the swelling agent, adhesion promoter or layer of dielectric material at a thickness of 10 Å to less than 300 Å.

6. The method according to claim 5, comprising depositing the swelling agent, adhesion promoter or layer of dielectric material at a thickness of 10 Å to 250 Å.

7. The method according to claim 1, comprising sealing the pores by:

depositing a swelling agent lining the sidewalls;
heating to swell the porous dielectric layer; and
rinsing with water.

8. The method according to claim 7, comprising heating at a temperature of 25° C. to 200° C.

9. The method according to claim 1, comprising depositing the swelling agent and subsequently heating to swell the porous dielectric layer.

* * * * *